(12) United States Patent
Kermalli

(10) Patent No.: US 7,196,578 B2
(45) Date of Patent: Mar. 27, 2007

(54) AMPLIFIER MEMORY EFFECT COMPENSATOR

(75) Inventor: Munawar Hussein Kermalli, Floral Park, NY (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/448,354

(22) Filed: May 30, 2003

(65) Prior Publication Data

US 2004/0239429 A1 Dec. 2, 2004

(51) Int. Cl.
*H03F 3/68* (2006.01)

(52) U.S. Cl. .................. 330/124 R; 330/295
(58) Field of Classification Search ............ 330/124 R, 330/295, 84, 107
See application file for complete search history.

(56) References Cited

U.S. PATENT DOCUMENTS

| 4,811,422 | A  | * | 3/1989 | Kahn ..................... 455/114.1 |
| 5,101,171 | A  | * | 3/1992 | Redmond ............... 330/124 R |
| 6,175,270 | B1 |   | 1/2001 | Vannucci |
| 6,201,452 | B1 | * | 3/2001 | Dent et al. .................. 332/103 |
| 6,242,979 | B1 | * | 6/2001 | Li ............................... 330/149 |
| 6,737,914 | B2 | * | 5/2004 | Gu ................................ 330/2 |
| 6,794,939 | B2 | * | 9/2004 | Kim et al. .................. 330/149 |

\* cited by examiner

*Primary Examiner*—Henry Choe

(57) ABSTRACT

An input signal is modified to compensate for amplifier memory effects by combining at least two versions of the input signal, each version of the input signal being offset in time with respect to one another. More specifically, an RF input signal is split into at least two split signals, a different delay is applied to each split signal, and the delayed, split signals are combined to obtain a modified input signal.

11 Claims, 6 Drawing Sheets

AMPLIFIER MEMORY EFFECT COMPENSATOR

BACKGROUND OF THE INVENTION

1. Technical Field

The present invention relates generally to compensating for memory effects of an amplifier.

2. Related Art

The function of an amplifier is to amplify a signal with as little signal distortion as is practical. An ideal amplifier is characterized as having a transfer function (input signal compared to output signal) which is completely linear with no transfer function discontinuities including memory effects, which is a type of hysterisis effect discussed in more detail below. Unfortunately, physical processes are seldom ideal and signal amplifiers are no exception. Amplifiers are specifically designed to operate as linearly and without memory effects as possible, but amplifier nonlinearities and memory effects are a reality in many amplifiers.

Because of natural and physical characteristics of amplifiers, amplified radio frequency (RF) output is often affected by hysteresis effects. Hysteresis is a distortion that is inherent to most amplifiers and affects the predistortion of amplifiers, which results in increased spectral regrowth and intermodulation. One type of hysterisis effect is known as a memory effect. Memory effects influence spectral regrowth and intermodulation distortion associated with amplifiers. The spectral regrowth and intermodulation distortion that is characteristic of memory effects of an amplifier are forms of signal distortion where extra frequencies are also transmitted. The transmission of extra frequencies can be power inefficient and cause interference to other RF systems. Memory effects are caused by signals affecting the physical properties of an amplifier such that the amplifier is residually affected by a previous signal when a present signal is being amplified. As an illustration of the above characteristics of amplifier memory effects, FIGS. 1 and 2 are provided.

FIG. 1 is an exemplary block diagram of a RF amplifier according to an exemplary embodiment of the invention. The typical RF amplifier system 100 of FIG. 1 includes a RF input 110 that is connected to an amplifier 120, the amplifier 120 outputs an amplified RF output 130. The amplifier 120 is a non-linear amplifier with memory effects.

FIG. 2 is an exemplary graph of a transfer function for an amplifier with memory effects according to an exemplary embodiment of the invention. The Y-axis represents the output voltage $V_{out}$ of amplifier 120 where the amplifier 120 has memory effect characteristics. The output voltage $V_{out}$ is plotted against the amplifier's input voltage $V_{in}$ along the X-axis. As shown, the resultant amplifier transfer function 220 is shown as thick and curving downward as input voltage $V_{in}$ increases and the resultant output voltage $V_{out}$ fails to likewise increase at the same rate. The transfer function 220 is thick due to the memory effects of the amplifier 120. The amplifier transfer function 220 curves downward in large part due to gain compression and other hysterisis factors that introduce spectral regrowth effects and intermodulation distortion.

SUMMARY OF THE INVENTION

According to an exemplary embodiment, an input signal is modified to compensate for amplifier memory effects by combining at least two versions of the input signal, each version of the input signal being offset in time with respect to one another. More specifically an RF input signal is split into at least two split signals, a different delay is applied to each split signal, and the delayed, split signals are combined to obtain a modified input signal.

According to another exemplary embodiment, an input signal is modified to compensate for amplifier memory effects by phase shifting an input signal and combining at least two versions of the phase shifted input signal, each version of the input signal being offset in time with respect to one another. More specifically, an RF signal is split into a first signal and a second signal, and the first signal is phase shifted out of phase with the second signal. A first delay and a second delay are applied to each of at least two of the phase shifted split signals. At least two versions of the phase shifted split signals are combined, to obtain a modified input signal.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXEMPLARY EMBODIMENTS

In a RF environment, where a high priority is placed upon effective and efficient utilization of limited bandwidth, memory effects that introduce spectral regrowth and intermodulation distortion are undesirable. The present invention provides a system and method to substantially overcome RF amplifier inefficiencies. The invention allows a controlled addition of memory effects supplied to an amplifier using a compensator such that the transfer function of the compensator approaches a desired inverse of the amplifier's memory effects.

Memory effects also limit the amount of correction achievable in a predistortion system because the transfer function used to linearize the amplifier output is not exactly the inverse function of the amplifier. The invention further allows a controlled addition of memory effects into the predistortion system such that the transfer function of the predistortion system approaches a desired inverse transfer function of the amplifier.

In disclosing the invention, first described are the compensation system and various schematics of a compensator according to embodiments of the invention. This is then followed by a desired transfer function of a compensator that helps overcome the unwanted memory effects. Finally discussed, is the transfer function of the compensator and amplifier.

Figure 3:
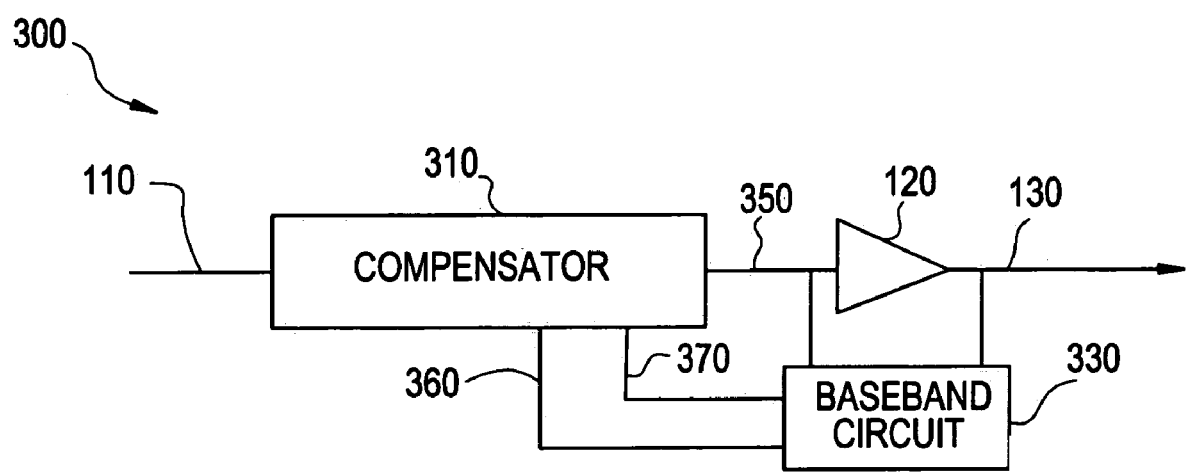
FIG. 3 is an example block diagram of a compensator system according to an embodiment of the invention.

FIG. 3 is an example block diagram of a compensator system according to an embodiment of the invention. As shown, the compensator system 300 includes a compensator 310 controlled by a first delay control signal 360 and a second delay control signal 370 supplied by baseband circuit 330.

The compensator 310 receives an RF signal 110 and outputs a memory compensated signal 350 to the amplifier 120. The compensator 310 distorts the RF signal 110 to overcome the memory effect characteristics of the amplifier 120.

The RF amplifier 120 receives the memory compensated signal 350, amplifies the memory compensated signal 350 by gain, G, and outputs a RF amplified output 130.

The memory compensated signal 350 and RF amplified output 130 are both inputs into the baseband circuit 330. The baseband circuit 330 receives the memory compensated signal 350 and the RF amplified output 130. With these two inputs 350, 130, the baseband circuit 330 determines adjustments to the delay control signals 360, 370 to optimize the performance of the compensator 310.

Figure 4:
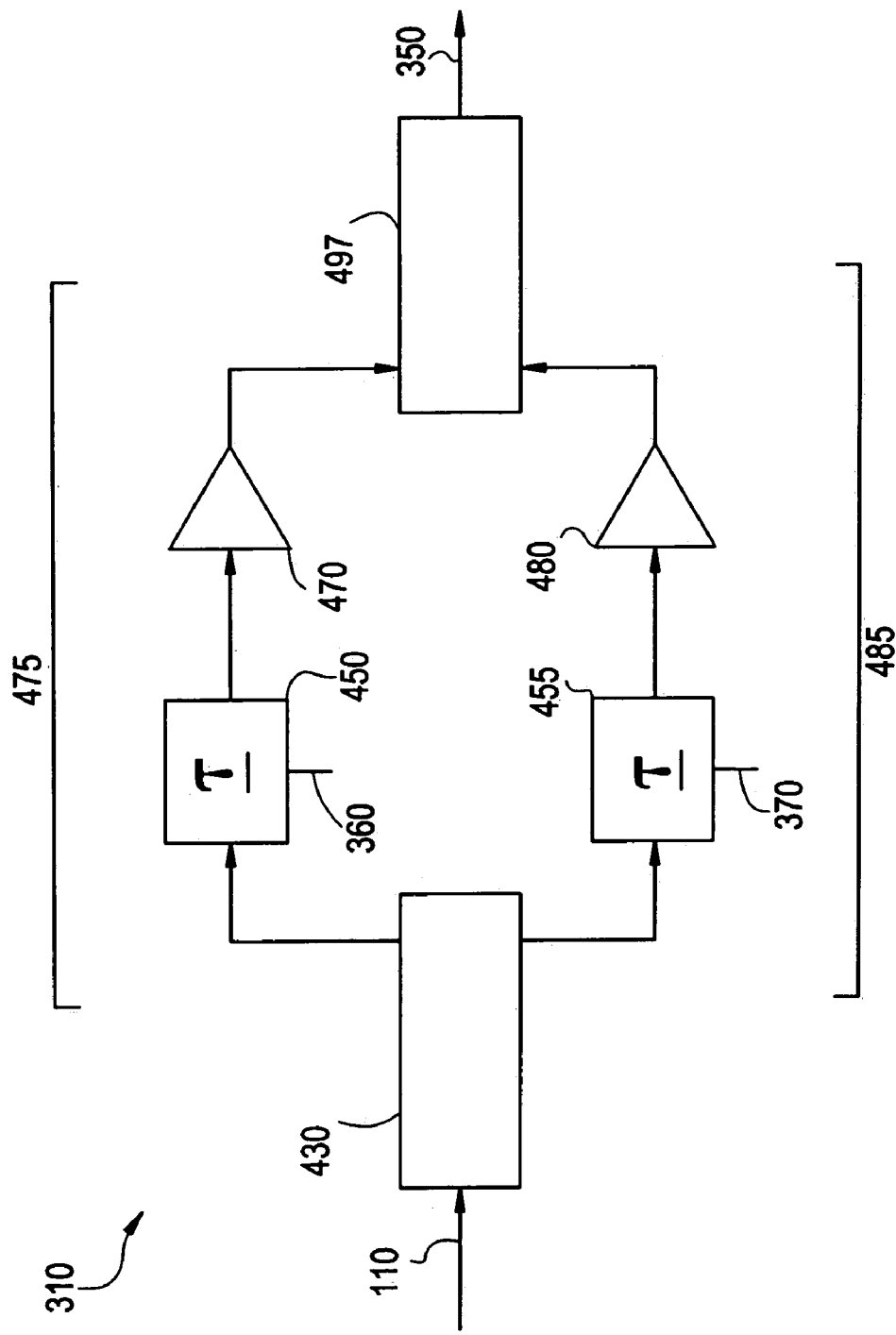
FIG. 4 is an example block diagram of the compensator in FIG. 3 according to an embodiment of the invention.

FIG. 4 is an example block diagram of the compensator 310 in FIG. 3. The compensator 310 includes a 2-way power splitter 430 which receives and splits the RF signal 110 into first and second signal signals. Each of the first and second signals travel through a separate signal path. The first signal path 475 begins at the 2-way power splitter 430 and includes a first delay circuit 450 that is connected to a first amplifier 470 which is finally connected to the 2-way combiner. 497. The second signal path 485 also begins at the 2-way power splitter 430, includes a second delay circuit 455 connected to a second amplifier 480, and terminates at the 2-way combiner 497. The first and second signal paths 475, 485 are parallel to each other.

The first amplifier 470 and the second amplifier 480 may be set to a reasonable equal gain depending on the signal needs of the RF amplifier 120.

The first delay circuit 450 and the second delay circuit 455 are controlled by the first delay control signal 360 and the second delay control signal 370, respectively, through connections to the baseband circuit 330. The delay circuits 450, 455 are delay blocks which change the amount of delay depending on the voltage applied to them. The delay circuits 450, 455 are adjusted independently to produce delays and a substantial inverse of the amplifier's memory effect. The generation of the first and second delay control signals will be discussed in detail below.

The baseband circuit 330 uses a digital signal processor (DSP) configured to produce the delay control signals 360, 370. The baseband circuit 330 monitors its inputs 130, 350 to retrieve a characteristic of the signals. The baseband circuit 330 then adjusts the first delay control signal 360 and the second delay control signal 370 in accordance with values stored in the baseband circuit 330 corresponding to the retrieved characteristic. Decreased distortion is achieved when delay circuits within the compensator 310 provide different delay times. The delay control signals 360, 370 may simply be a change of voltage applied to delay circuits within the compensator 310. The delay produced by the delay circuits within the compensator 310 changes as the voltage supplied to them via the control signals 360, 370 changes.

Figure 5:
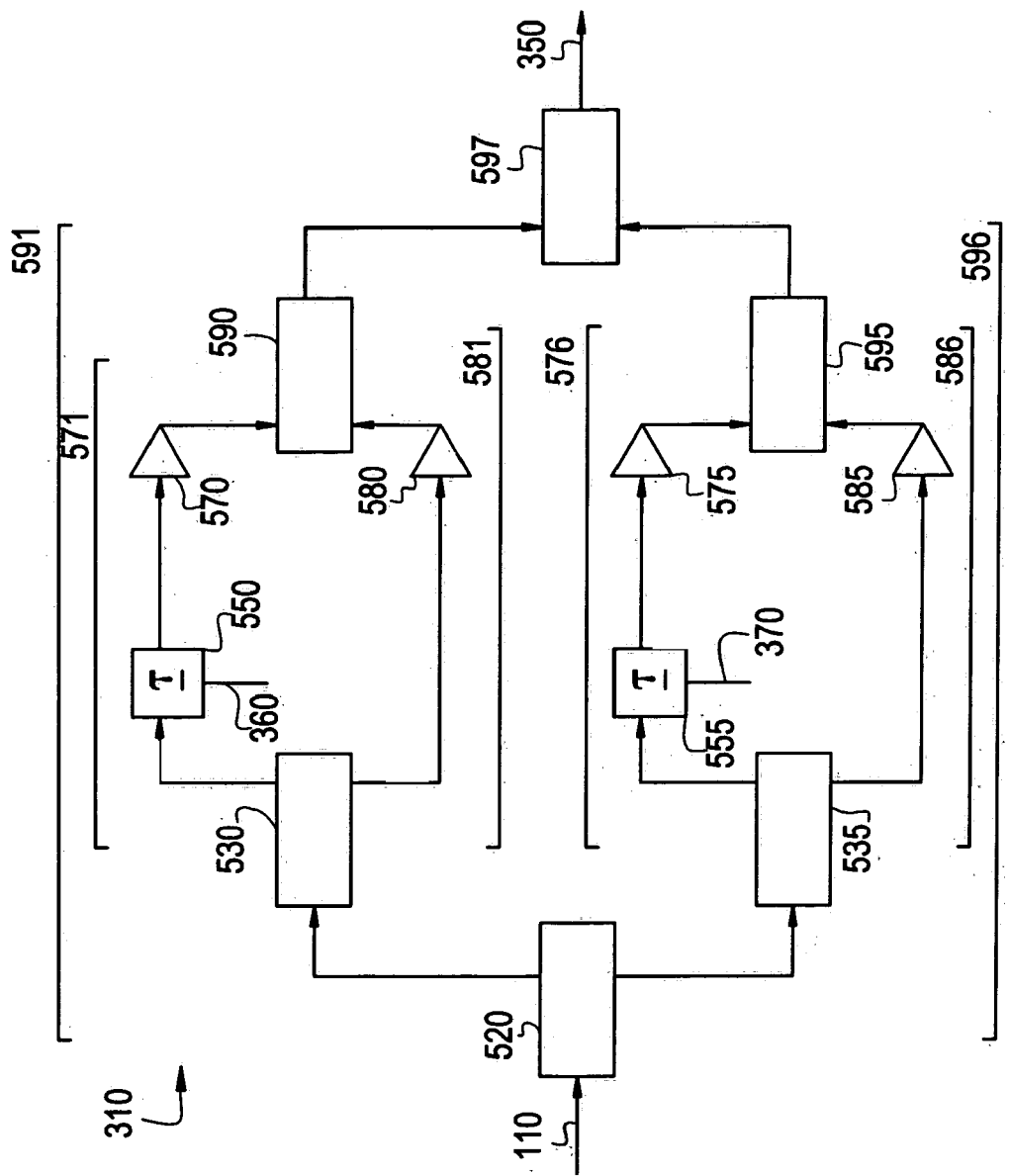
FIG. 5 is an example of the compensator in FIG. 3 that implements a quadrature split according to an embodiment of the invention.

In another embodiment, additional components may be added to the compensator 310 forming a quadrature split. In addition to the memory compensation, the quadrature split configuration of the compensator also performs phase compensation. FIG. 5 is an example of a compensator 310 implementing a quadrature split according to an embodiment of the invention. As shown, the compensator 310 receives an RF signal 110 and outputs a memory compensated signal 350. The compensator 310, in this embodiment, includes a 2-way power splitter 520 which receives and splits the RF signal 110 into first and second signals. The 2-way power splitter 520 in addition to splitting the RF signal 110, introduces a phase adjustment such that the first signal is 90° out of phase with the second signal. Each of the first and second signals travel through a first signal path 591 and a second signal path 596, respectively. The first signal path 591 and second signal path 596 are parallel to each other.

The first signal path 591 begins at 2-way power splitter 520; includes a signal power splitter 530, third signal path 571, a fourth signal path 585, and a signal combiner 590; and ends at 2-way combiner 597. The 2-way power splitter 530 splits its incoming signal into the third signal path 571 and the fourth signal path 581. The third signal path 571 begins at the 2-way power splitter 530, includes a first delay circuit 550 connected to a first amplifier 570, and terminates at the 2-way combiner 590. The fourth signal path 581 also begins at the 2-way power splitter 530, and includes a second amplifier 580 connected to the 2-way combiner 590. The third signal path 571 and the fourth signal path 581 are parallel to each other.

The second signal path 596 begins at the 2-way power splitter 520; includes another 2-way power splitter 535, a fifth signal path 576, a sixth signal path 586, a 2-way combiner 595; and ends at the 2-way combiner 597. The 2-way power splitter 535 splits its incoming signal into the fifth signal path 576 and the sixth signal path 586. The fifth signal path 576 begins at the 2-way power splitter 535, includes a second delay circuit 555 connected to a third amplifier 575, and terminates at the 2-way combiner 595. The sixth signal path 586 also begins at the 2-way power splitter 535 and includes a fourth amplifier 585 connected to the 2-way combiner 595. The fifth signal path 576 and the sixth signal path 586 are parallel to each other.

The processed first and second signals are combined at the signal combiner 597 to produce the memory compensated signal 350. The memory compensated signal is then fed to the RF amplifier 120 (not shown).

The first delay circuit 550 and the second delay circuit 555 are delay blocks, and are controlled by the first delay control signal 360 and the second delay control signal 370, respectively, through connections to the baseband circuit 330 (not shown) in the same manner that first and second delay circuits 450 and 455 in the embodiment of FIG. 4 were controlled. Accordingly, the first and second delay circuits 550, 555 may be adjusted independently to produce delays and a substantial inverse of the amplifier's transfer function. While phase compensation is typically fixed, the baseband circuit may be augmented to additionally change the phase in the 2-way power splitter 520.

Figure 6:
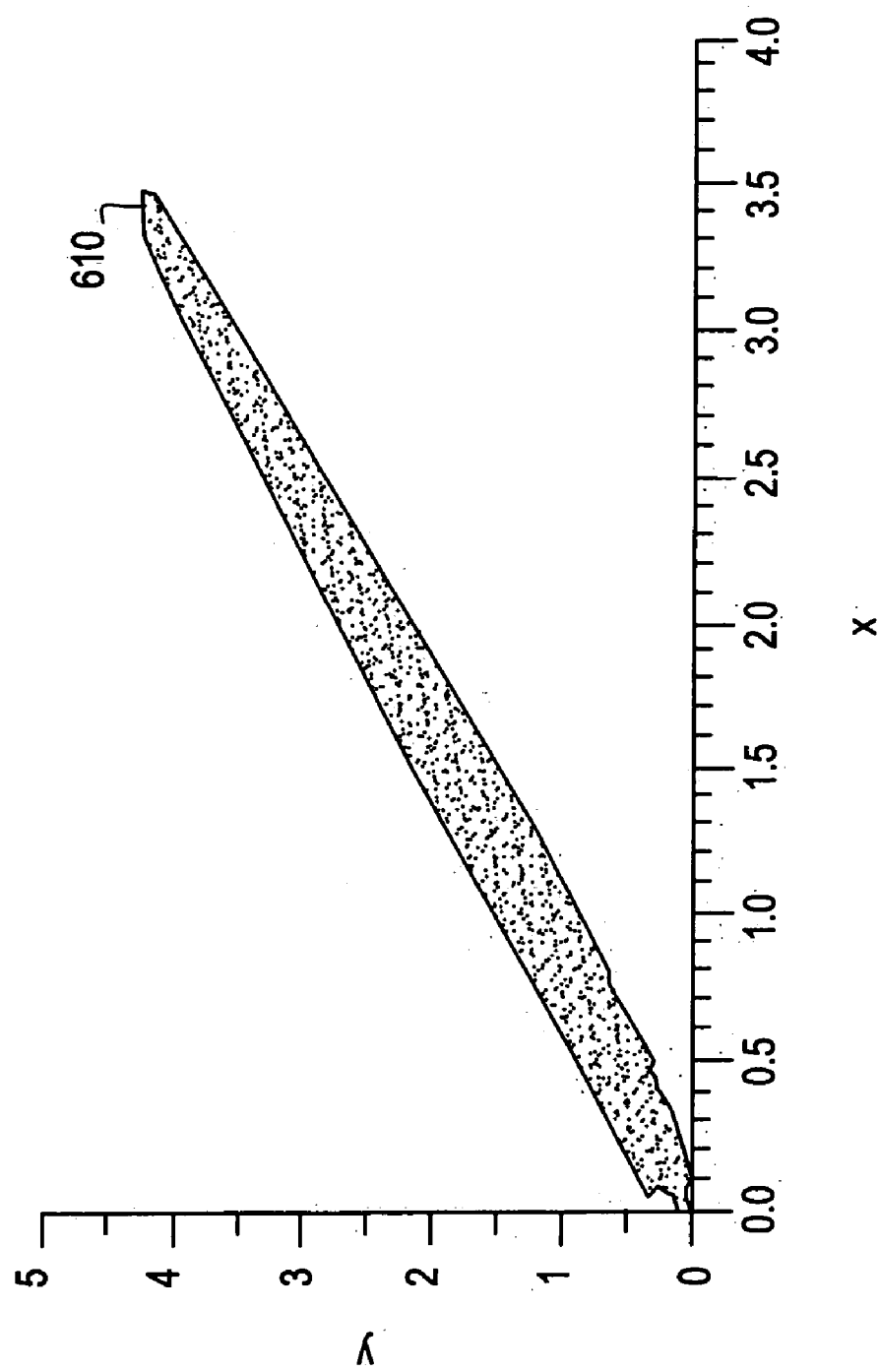
FIG. 6 shows an example transfer function of the compensator according to an embodiment of the invention.

FIG. 6 shows an example transfer function of the compensator according to an embodiment of the invention. The x axis represents input voltage $V_{in}$ and the y axis represents output voltage $V_{out}$ of the compensator 310. The diagonal thick line represents the transfer function 610 of the compensator 310. The transfer function 610 shown is for the compensator 310 of FIG. 5, using a 5 nanosecond delay in each delay circuit 550, 555. A similar graph would result for similar conditions as applied to the compensator 310 of FIG. 4. The compensator 310 intentionally distorts a signal prior to amplification, in order to compensate for the memory effects of the actual RF signal amplifier. The output of the compensator 310 is a net result of the input signal 110 and an intentional distortion introduced by the compensator 310 which anticipates and helps cancels the RF signal amplifier memory effects.

Figure 1:
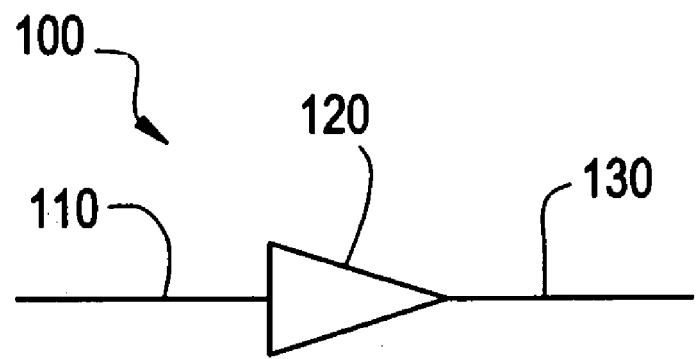
FIG. 1 is an exemplary block diagram of a prior art RF amplifier with memory effects according to an embodiment of the invention.
Figure 2:
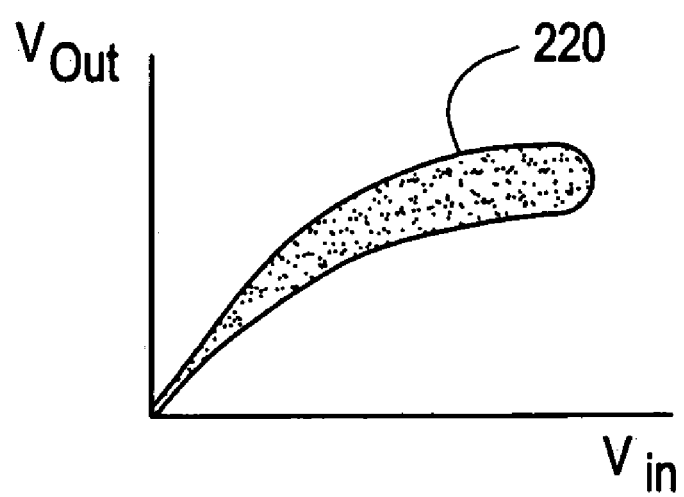
FIG. 2 is an exemplary graph of a transfer function for an amplifier with memory effects according to an embodiment of the invention.
Figure 7:
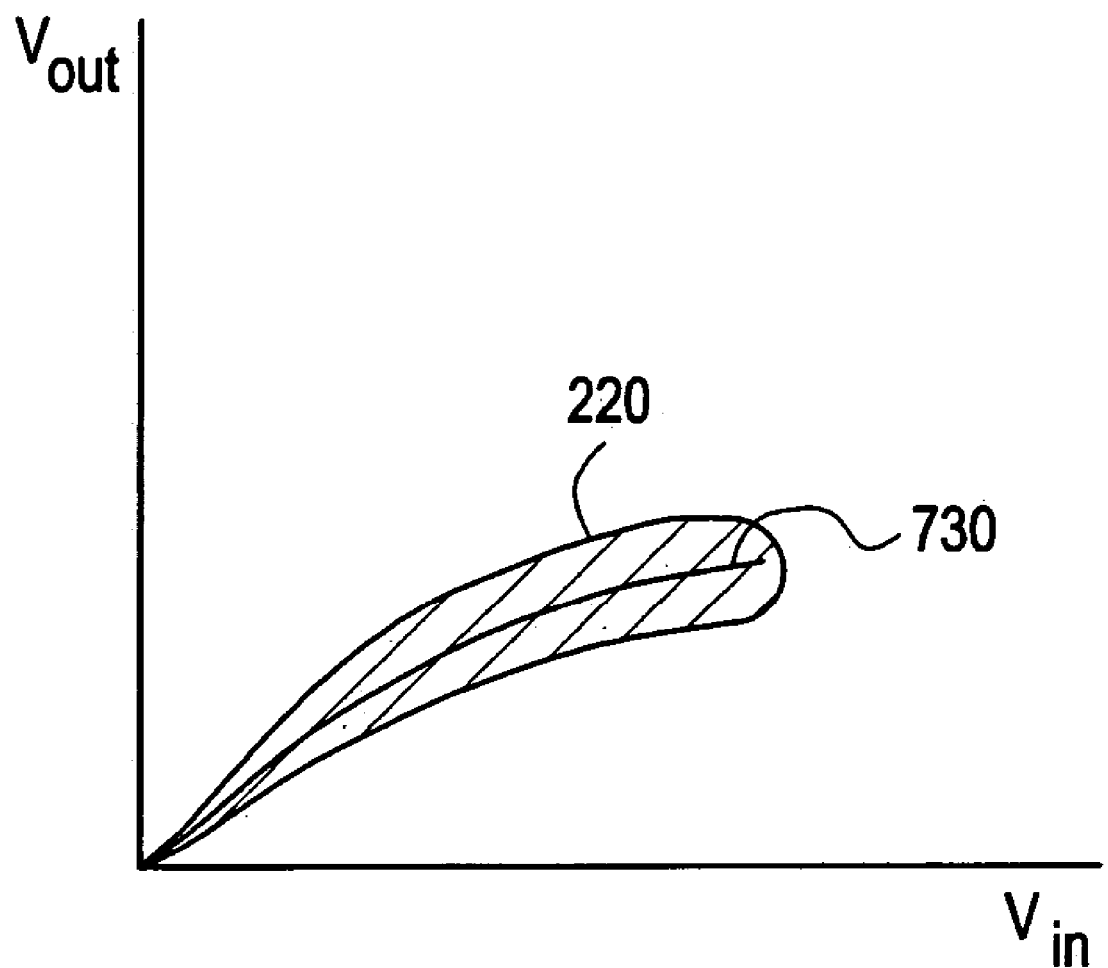
FIG. 7 is a graph illustrating a comparison between the transfer functions of a non-linear RF amplifier with memory compensation and a non-linear RF signal amplifier without memory compensation according to an embodiment of the invention.

FIG. 7 illustrates the transfer function 220 of the amplifier 120 as shown in FIG. 1, and further illustrates the transfer function 730 of the compensation system of FIG. 4. Component input voltage $V_{in}$ is plotted along the horizontal axis, while component output voltage $V_{out}$ is plotted along the vertical axis. As shown, the memory effects of the amplifier 120 are significantly reduced by the compensation system of the present invention. Although the transfer functions of FIG. 7 are represented in terms of voltages, other parameters may be used for transfer function definition (such as current or power) as would best apply to certain amplifier configurations and as would be apparent to those skilled in the art.

In another alternative embodiment of the invention, the compensator 310 may include more than two delays and receive more than two delay control signals to control each of the delay circuits within.

Moreover, in an alternative embodiment, the compensator 310 may be used as a distorter with memory compensation if distortion components are used instead of the amplifiers as described in FIGS. 4 and 5 below. To accomplish this with the compensator 310 shown in FIG. 4, for example, the first amplifier 470 and the second amplifier 480 may be replaced with a first predistortion component and a second predistortion component, respectively. The predistortion components may be a predistortion amplifier, predistortion diode, or other predistortion device. If predistortion amplifiers are used, each predistortion amplifier would receive and be controlled by a magnitude control signal and a phase control signal as is well known. For example, the baseband circuit 330 may be used to provide the control signals to a predistortion component. This configuration of the compensator 310 provides memory compensation to diminish memory affects and predistortion to assist in making output of the RF amplifier 120 linear.

In an alternative embodiment, the compensator 310 may provide memory compensation, phase compensation characteristics, and linear predistortion characteristics. This configuration provides memory compensation to diminish memory effects, phase compensation to diminish phase effects, and linear predistortion to assist in making the RF amplifier 120 output linear. To accomplish this with, for example, the compensator 310 as shown in FIG. 5, the first through fourth amplifiers 570, 580, 575, 585 and may be replaced with predistortion components. The predistortion components may be a predistortion amplifier, predistortion diode, or other predistortion device. The predistortion amplifiers are controlled by a magnitude control signal and a phase control signal as is well known. For example, the baseband circuit 330 may be used to provide the control signals.

In another embodiment, the compensator 310 of FIG. 4 may include multiple paths that can be added to the compensator 310 by replacing the 2-way splitter 430 and combiner 497 with an N-way splitter and N-way combiner, respectively. The resulting N identical paths each include a delay circuit and amplifier. The baseband circuit 330 supplies separate delay control signals to each delay circuit to achieve a finer control of the transfer function of the compensator 310; and therefore, the memory effect compensation.

In still another embodiment of the compensator of FIG. 5, a third delay circuit and a fourth delay circuit could be added to the compensator 310 just before the amplifiers 570, 580, respectively, and likewise connected to the baseband circuit 330 to enhance memory compensation control.

The above invention has several benefits that may be applied to RF amplification. The memory effects of RF amplifiers cause extra unwanted frequencies to be transmitted which interfere with other RF systems and limit the achievable correction in a predistortion system. Moreover, memory effects reduce the efficiencies of an RF system since power is lost due to the unintended transmission of unwanted signals. The invention helps reduce the influence of memory effects on the outputs of RF amplifiers.

It is noted that the functional blocks in the embodiments of FIGS. 3–5 may be implemented in hardware and/or software. Moreover, while FIGS. 3–5 show the invention used with a RF amplifier, the invention may also be used in conjunction with other components that have or do not have memory characteristics. Still further, the invention may also be used with components with linear characteristics. The hardware/software implementations may include a combination of processor(s) and article(s) of manufacture. The article(s) of manufacture may further include storage media and executable computer program(s). The executable computer program(s) may include the instructions to perform the described operations. The computer executable program(s) may also be provided as part of externally supplied propagated signal(s) either with or without carrier wave(s).

This specification describes various exemplary embodiments of the method and system of the present invention. The scope of the claims are intended to cover various modifications and equivalent arrangements of the illustrative embodiments disclosed in this specification. Therefore, the following claims should be accorded the reasonably broadest interpretations to cover modifications, equivalent structures in features which are consistent with the spirit and the scope of the invention disclosed herein.

The invention claimed is:

1. A method comprising:
    modifying an input signal to compensate for amplifier memory effects by:
    splitting an RF input signal into at least two split signals, applying a different delay to each of the at least two split signals, amplifying each of the at least two split signals and,
        combining the at least two of the delayed, amplified split signals to obtain
    a modified input signal; and,
    amplifying the modified input signal.

2. The method of claim 1, wherein the amplifying includes predistorting the delayed split signals.

3. A method comprising:
    modifying an input signal to compensate for amplifier memory effects by:
        splitting an RF signal into a first signal and a second signal, and phase shifting the first signal out of phase with the second signal,
        applying a first delay and a second delay to the first and second phase shifted split signals, respectively,
        amplifying each of the delayed first and second phase shifted split signals, and combining the amplified delayed first and second phase shifted split signals, to obtain a modified input signal; and amplifying the modified input signal.

4. The method of claim 3, wherein the amplifying includes predistorting the delayed phase shifted split signals.

5. A compensator for compensating the memory effects of an amplifier, comprising:
  a splitter configured to split an RF input signal into at least two split signals;
  at least two time delays configured to apply a different time delay to each of the least two split signals;
  a plurality of compensator amplifiers configured to amplify each of the at least two time delayed split signals prior to combining;
  a combiner configured to combine each of the at least two amplified time delayed split signals to obtain an input signal modified to compensate for amplifier memory effects; and
  an amplifier configured to amplify the modified input signal.

6. The compensator of claim 5, wherein the amplifier is configured to predistort the time delayed split signals.

7. The compensator of claim 5, wherein each of the at least two time delays receive signals including delay time information.

8. A compensator for compensating the memory effects of an amplifier, comprising:
  a splitter configured to split an RF signal into a first signal and a second signal;
  a shifter configured to phase shift the first signal out of phase with the second signal;
  a first delay and a second delay configured to delay the first and second phase shifted split signals, respectively;
  a plurality of compensator amplifiers configured to amplify the first and second delayed phase shifted split signals prior to combining;
  a combiner configured to combine the first and second phase shifted split amplified signals, to obtain a modified input signal; and
  a first amplifier configured to amplify the modified input signal.

9. The compensator of claim 8, wherein each of the plurality of compensator amplifiers is configured to predistort the delayed, phase shifted split signals.

10. A compensator for compensating the memory effects of an amplifier, comprising:
  a splitter configured to split an RF signal into a first and second signal;
  a first signal delay circuit configured to receive the first signal;
  a second signal delay circuit configured to receive the second signal, the first and second delay circuits delaying the first and second signals, respectively, for different time periods;
  a plurality of compensator amplifiers configured to amplify the first and second delayed phase shifted split signals prior to combining;
  a signal combiner configured to combine the delayed first signal and the delayed second signal to obtain a signal modified to compensate for amplifier memory effects; and
  a first amplifier configured to amplify the modified input signal.

11. The compensator of claim 10, wherein each of the plurality of compensator amplifiers is configured to predistort the delayed, phase shifted split signals.

* * * * *